(12) United States Patent
Huang et al.

(10) Patent No.: US 7,271,103 B2
(45) Date of Patent: Sep. 18, 2007

(54) SURFACE TREATED LOW-K DIELECTRIC AS DIFFUSION BARRIER FOR COPPER METALLIZATION

(75) Inventors: Kuei-Wu Huang, Hsin-Chu (TW); Ai-Sen Liu, Hsinchu (TW); Baw-Ching Perng, Hsinchu (TW); Ming-Ta Lei, Hsin Chu (TW); Wen-Kai Wan, Hsin Chu (TW); Cheng-Chung Lin, Taipei (TW); Yih-Shung Lin, Taipei (TW); Chia-Hui Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 218 days.

(21) Appl. No.: 10/687,713

(22) Filed: Oct. 17, 2003

(65) Prior Publication Data

US 2005/0085083 A1    Apr. 21, 2005

(51) Int. Cl.
*H01L 21/302* (2006.01)
(52) U.S. Cl. .............. 438/706; 438/533; 438/622; 438/643
(58) Field of Classification Search ........ 438/706, 438/710, 712, 714, 720, 648, 653, 6, 622, 438/643, 533
See application file for complete search history.

(56) References Cited

U.S. PATENT DOCUMENTS

| 6,339,025 | B1 | 1/2002 | Liu et al. | |
|---|---|---|---|---|
| 6,506,677 | B1 | 1/2003 | Avanzino et al. | |
| 6,537,913 | B2 | 3/2003 | Modak | |
| 6,541,374 | B1* | 4/2003 | de Felipe et al. | 438/648 |
| 6,562,725 | B2 | 5/2003 | Tsai et al. | |
| 6,583,046 | B1* | 6/2003 | Okada et al. | 438/622 |
| 6,917,109 | B2* | 7/2005 | Lur et al. | 257/758 |
| 2003/0205823 | A1* | 11/2003 | Leu et al. | 257/774 |
| 2004/0041267 | A1* | 3/2004 | Kakamu et al. | 257/758 |
| 2004/0092098 | A1* | 5/2004 | Sudijono et al. | 438/637 |

* cited by examiner

*Primary Examiner*—Lan Vinh
(74) *Attorney, Agent, or Firm*—Duane Morris LLP

(57) ABSTRACT

A Cu damascene structure is formed where Cu diffusion barrier is formed by treating the top surface of the surrounding low-k interlayer dielectric with nitrogen or carbon containing medium to form a silicon nitride or silicon carbide diffusion barrier rather than capping the top surface of the Cu with metal diffusion barrier as is conventionally done.

12 Claims, 3 Drawing Sheets

SURFACE TREATED LOW-K DIELECTRIC AS DIFFUSION BARRIER FOR COPPER METALLIZATION

FIELD OF THE INVENTION

The present invention relates to a method of fabricating a semiconductor device, and more particularly, to an economical method of forming a diffusion barrier for copper (Cu) and/or Cu alloy metallization by modifying the surface properties of the low-k interlayer dielectric layers.

BACKGROUND OF THE INVENTION

In many high performance, high density semiconductor devices, Cu or Cu alloy is used for the conductive material in the metallization layers. Cu or Cu alloy is generally preferred over aluminum-based metallization in these applications because Cu is a better electrical conductor and is more resistant than aluminum to electromigration. Cu interconnect structures found in these semiconductor devices comprise a substrate, typically doped monocrystalline silicon, and a plurality of sequentially formed low-k interlayer dielectrics and patterned conductive structures formed from Cu (or Cu alloy) based metallization.

But, because Cu diffuses through the low-k interlayer dielectric materials, the Cu interconnect structures must be encapsulated by a diffusion barrier layer. Otherwise the diffused Cu metal in the low-k interlayer dielectric will result in current leakage between the interconnect structures. The diffusion barrier is typically a metal layer. Typical metal diffusion barrier metals include tantalum, tantalum nitride, titanium, titanium nitride, titanium-tungsten, tungsten, tungsten nitride, titanium silicon nitride, tungsten silicon nitride, tantalum silicon nitride and silicon nitride.

Shown in FIG. 1 is a schematic cross-sectional diagram of a Cu interconnect structure 150 having a conventional diffusion barrier, a Cu capping layer 130. A Cu interconnect structure 150 and a low-k interlayer dielectric layer 110 are formed on a substrate 100. The substrate 100 may be any surface, generated when making a semiconductor device, upon which a dielectric layer may be formed. The bottom and sides of the Cu interconnect structure 150 are encapsulated with a barrier layer 120 to prevent Cu from diffusing into the low-k interlayer dielectric 110. The barrier layer 120 typically comprises a blanket layer of refractory material, such as, tantalum, tantalum nitride, or titanium nitride. The exposed top surface of the Cu interconnect structure 150 is then capped with a diffusion barrier layer 130 of thin silicon nitride barrier. Generally, another dielectric layer or other type of passivation layer 140 may be deposited on top of the structure shown in FIG. 1 and the Cu capping layer 130 prevents Cu from diffusing into the surrounding low-k interlayer dielectric 110, which could result in electrical short between the Cu interconnect structure 150 and another neighboring Cu interconnect structure 151. The neighboring Cu interconnect structure 151 is encapsulated with its own set of diffusion barriers 121 and 131. The capping diffusion barriers 130 and 131 prevent copper diffusion between the metal lines 150 and 151 which would cause unwanted electrical shorts.

The Cu capping process involves depositing a blanket of a diffusion barrier material, silicon nitride, and then removing the excess material from the top surface of the surrounding interlayer dielectric 110 by chemical-mechanical polishing (CMP). After removing the excess barrier material by CMP, the Cu capping layer 130 remains over the Cu interconnect structure 150. This conventional method of capping the Cu in damascene process is generally complex and costly and economical alternate process solutions are helpful in reducing the manufacturing costs.

SUMMARY OF THE INVENTION

According to an aspect of the present invention, a method is disclosed herein for treating the surface of low-k dielectric material to form a diffusion barrier to neighboring copper (Cu) interconnect metal structures in an interconnection structure of a semiconductor device. The method comprises modifying the surface properties of the low-k interlayer dielectric so that the modified surface acts as a diffusion barrier to Cu. This may be achieved by treating the surface of the low-k dielectric with atoms of appropriate material, such as nitrogen or carbon containing medium, to form a thin surface layer of silicon nitride or silicon carbide, respectively, on the low-k dielectric that is chemically inert to Cu. The treatment method may include silicon containing medium when treating an organic based low-k dielectric. The surface treatment can be achieved by techniques, such as, for example, plasma surface treatment, ion implantation, and chemical reaction.

BRIEF DESCRIPTION OF THE DRAWINGS

The invention will be better understood from the following detailed description of an exemplary embodiment thereof in conjunction with the accompanying drawings in which.

Features shown in the above referenced drawings are not intended to be drawn to scale, nor are they intended to be shown in precise positional relationship.

DETAILED DESCRIPTION OF THE INVENTION

The method according to an embodiment of the present invention prevents copper diffusion between metal lines eliminates the need for capping a Cu interconnect structure with a diffusion barrier in a semiconductor damascene structure.

Figure 2:
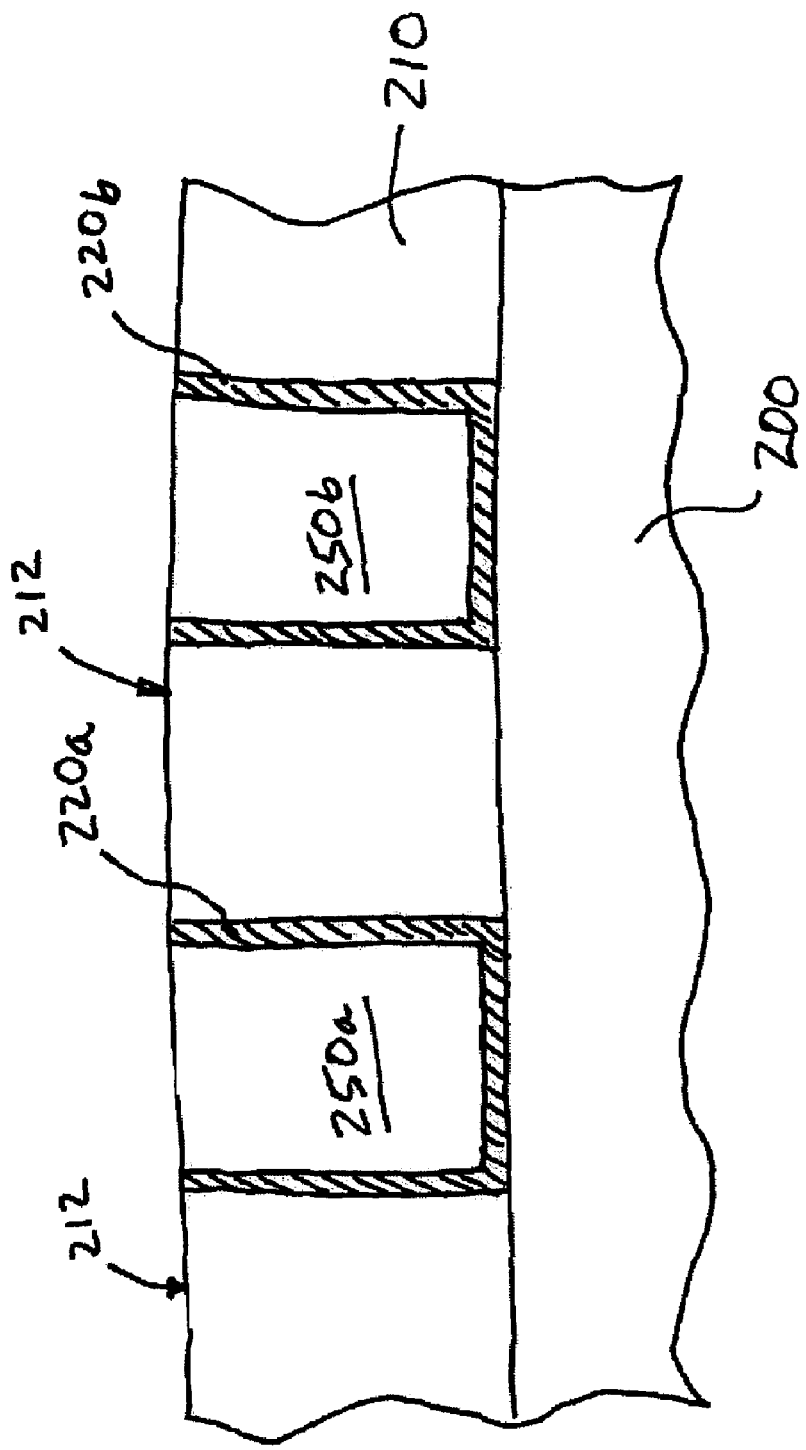
FIG. 2 is a schematic cross-sectional illustration of a Cu damascene structure at an interim stage before a Cu diffusion barrier is formed on top surface of the low-k interlayer dielectric layer according to an embodiment of the present invention.

Shown in FIG. 2 is a schematic cross-sectional illustration of a Cu damascene structure formed on a substrate 200 depicting two Cu interconnect structures 250a and 250b that are illustrative of a plurality of Cu interconnect structures that may be formed on the substrate 200. After via holes or trenches have been etched into a low-k interlayer dielectric layer 210 and filled with Cu to form the Cu interconnect structures 250a and 250b. The process of forming such Cu damascene structure is well known in the art and need not be elaborated here. The side walls and the bottom of the Cu interconnect structures 250a and 250b are encapsulated with a diffusion barriers 220a and 220b, respectively.

The substrate 200 may be any surface, generated when making a semiconductor device, upon which a dielectric layer may be formed. The substrate 200 may include, for example, active and passive devices that are formed on a silicon wafer such as transistors, capacitors, resistors, diffused junctions, gate electrodes, local interconnects, etc. The substrate 200 also may include one or more conductive layers that are separated from each other, or from such active and passive devices, by one or more dielectric layers.

The low-k interlayer dielectric layer 210 is typically silicon based organic-inorganic hybrids, such as, hydrogen silsesquioxane ("HSQ") and methyl silsesquioxane ("MSQ"), etc. The diffusion barrier layers 220a and 220b prevent the Cu interconnect structures 250a and 250b from diffusing into the low-k interlayer dielectric layer 210. The diffusion barrier layers 220a and 220b may comprise a refractory material, such as tantalum, tantalum nitride, or titanium nitride.

Figure 1:
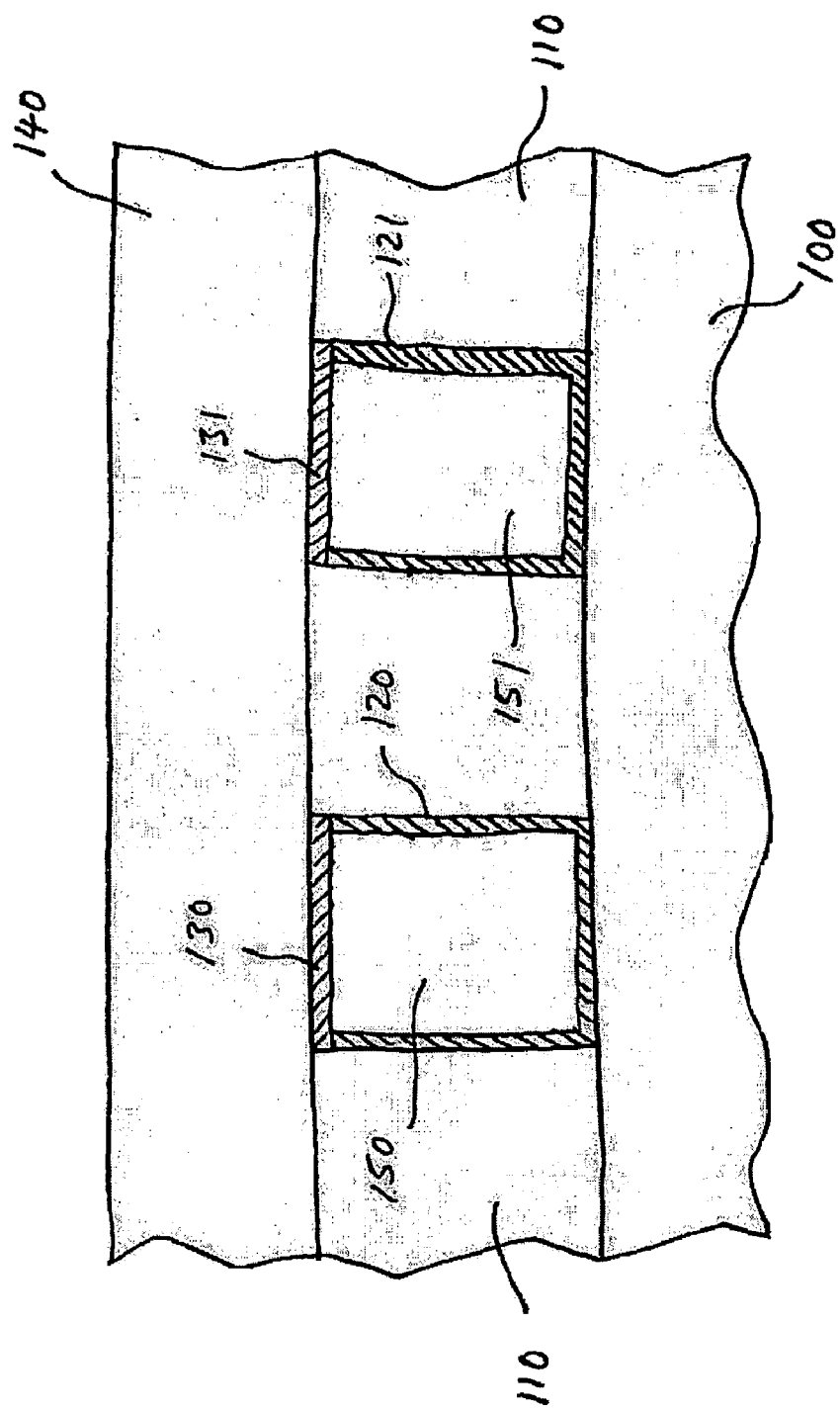
FIG. 1 is a schematic cross-sectional illustration of a prior art Cu damascene structure in which a Cu metallization is capped with silicon nitride layer.
Figure 3:
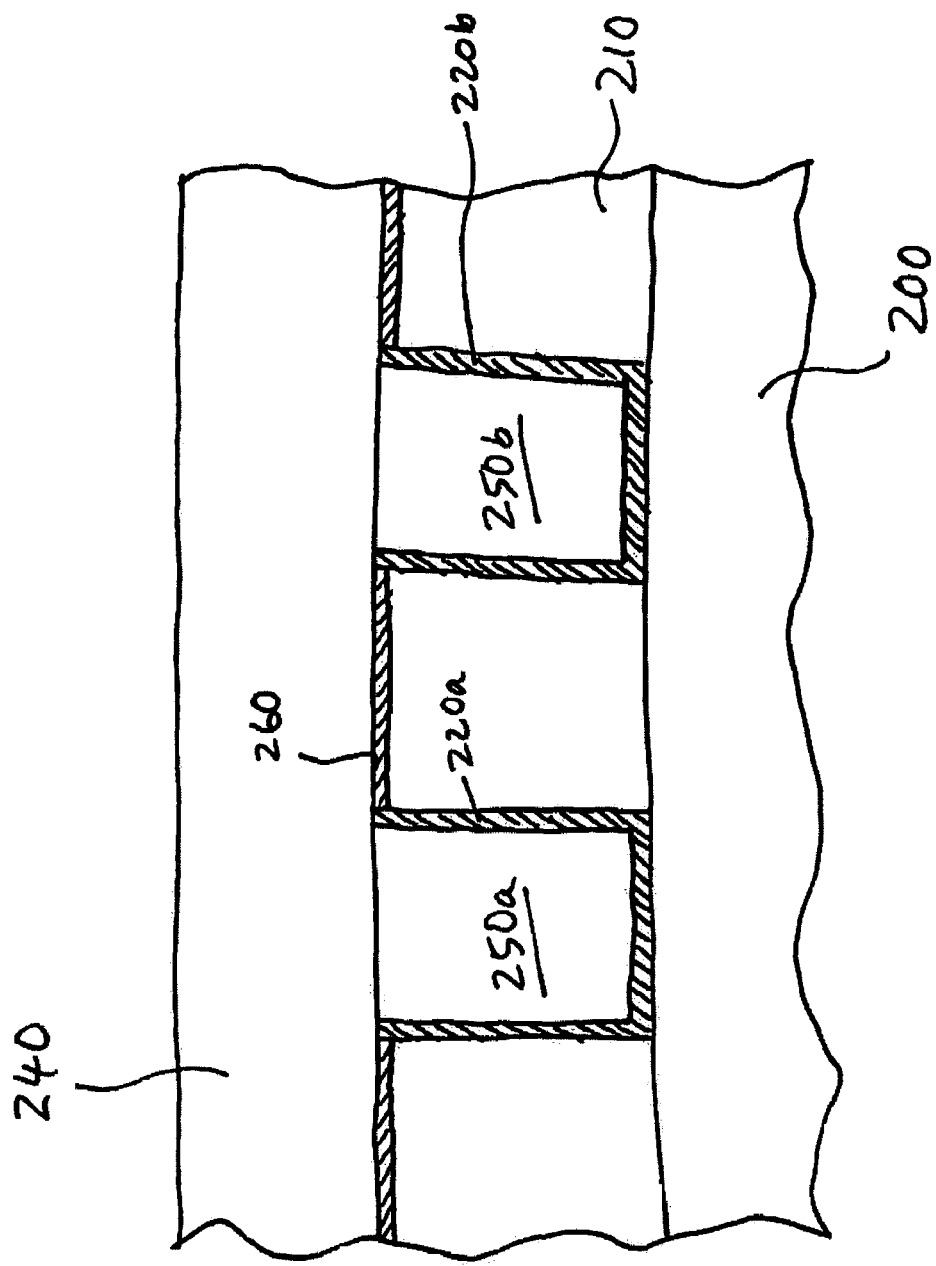
FIG. 3 is a schematic cross-sectional illustration of the Cu damascene structure of FIG. 2 after the Cu diffusion barrier has been formed according to an embodiment of the present invention.

FIG. 3 illustrates the Cu damascene structure of FIG. 2 after top surface 212 of the low-k interlayer dielectric 210 has been treated with a method according to an embodiment of the present invention to form a Cu diffusion barrier layer 260. According to an aspect of the present invention, the top surface 212 of the low-k interlayer dielectric layer 210 is treated by, for example, plasma surface treatment, ion implantation, or chemical reaction. In an embodiment of the present invention, utilizing plasma surface treatment, the top surface 212 of the low-k dielectric layer 210 is bombarded by nitrogen atoms from a plasma formed from nitrogen-containing gases, such as N2 or ammonia. The nitrogen atoms from the plasma will bond with the native silicon atoms in the low-k dielectric material, near the surface of the dielectric, to form a thin layer 260 (less than 100 Å thick) of silicon nitride on the top surface 212 of the low-k interlayer dielectric layer 210. Silicon nitride is chemically inert to Cu and is a good diffusion barrier to Cu. The silicon nitride layer 260 does not need to be as thick as the deposited Cu capping layers 130 and 131 found in conventional Cu damascene structure illustrated in FIG. 1. The silicon nitride layer 260 formed according to the present invention is typically less than 100 angstroms and preferably less than 50 angstroms thick. Because the silicon nitride layer 260 does not need to be as thick as the conventional Cu capping layers, the associated process time is shorter and more economical. Plasma surface treatment process is well known in the art and the process can be readily controlled to achieve a desired thickness of the silicon nitride layer 260. After the Cu diffusion barrier layer 260 is formed, the whole structure is typically covered with another layer of dielectric or passivation material 240.

In another embodiment of the present invention, ion implantation method may be employed using nitrogen-containing gases, such as N2 or ammonia, under high accelerating voltage, about 20-100 keV, to form the silicon nitride layer 260. The particular accelerating voltage value may be adjusted depending on the particular doping gas used. Again, the details of the ion implantation process need not be discussed here because ion implantation is a well known process and can be readily applied to achieve a desired thickness of the silicon nitride layer 260.

In both the plasma surface treatment and the ion implantation embodiments, Carbon-containing gases, such as CO2, may be substituted for the nitrogen containing gases. In which case, the resulting passivation layer will be silicon carbide rather than silicon nitride. Silicon nitride layer is less than 100 angstroms and preferably less than 50 angstroms thick.

Where the low-k dielectric layers are polymeric dielectrics rather than silicon based dielectrics, the plasma surface treatment of the dielectric can be conducted with silicon containing gas sources along with nitrogen containing gases in the plasma to form a thin silicon nitride layer for passivation. Silicon containing gases such as $SiH_4$, $Si(CH_3)_4$, and $Si(CH_3)_3H$ may be used.

In another embodiment of the present invention, a thin layer (less than 100 Å thick) of material that contains silicon and nitrogen may be deposited, for example, by vaporization and then curing the layer to form silicon nitride. The curing may be achieved by baking, E-beam or UV depending on the particular material used. Again, the passivation layer formed on the top surface of the polymeric dielectric is a silicon nitride layer.

In another embodiment of the present invention, chemicals that contain silicon and nitrogen can be applied to the surface of the low-k interlayer dielectric to form a thin layer of silicon nitride on the surface of the low-k interlayer dielectric through a spontaneous chemical reaction. Silicon and nitrogen contained in the chemicals react at the surface to spontaneously (i.e. without any catalysts) form a thin layer of silicon nitride. An elevated temperature, between 50-100 deg. C. may be needed to enhance the chemical reaction rate. This process does not deposit a layer of film (generally greater than 100 angstroms thick) but the chemicals react with the surface of the low-k dielectric to form a thin layer of silicon nitride for passivation. The thin layer of silicon nitride is, thus, less than 100 angstroms and preferably less than 50 angstroms thick. This embodiment is equally applicable to forming a silicon carbide layer as the passivation layer by using chemicals that contain silicon and carbon.

It should be noted that the silicon nitride layer that is formed on the surface of the low-k interlayer dielectric according to the present invention is much thinner than the conventional diffusion barrier layer found in conventional dual damascene structures. The silicon nitride layer formed on the top surface of the low-k interlayer dielectric according to the method of the present invention is less than 100 angstroms and preferably less than 50 angstroms thick.

The method according to the present invention provide more economical way of forming a Cu diffusion layer in processes such as a single or a dual damascene process for forming the Cu interconnect structures in semiconductor devices. It will be obvious to those skilled in the art that the method of the present invention disclosed herein can be applied to other applications where Cu diffusion across a Cu to dielectric interface is a concern.

While the foregoing invention has been described with reference to the above embodiments, various modifications and changes can be made without departing from the spirit of the invention. For example, other methods or techniques that may be employed to form a thin passivation layer on the surface of low-k dielectric layers by treating the surface of the dielectric are considered to be within the scope of the invention defined by the appended claims.

What is claimed is:

1. A method of forming a copper diffusion barrier on a top surface of a low-k interlayer dielectric layer in a semiconductor device, the method comprising: forming at least two copper interconnect structures within the low-k interlayer dielectric layer; and treating the top surface of the low-k interlayer dielectric layer to transform a thin surface layer of the low-k interlayer dielectric layer into a copper diffusion barrier, wherein the step of treating the top surface of the low-k interlayer dielectric layer consists essentially of ion implantation using carbon dioxide, and wherein the copper diffusion barrier is a layer of silicon carbide less than 50 angstroms thick.

2. The method according to claim 1, wherein the copper interconnection structure is a dual damascene structure.

3. The method according to claim 1, wherein the copper interconnection structure is a single damascene structure.

4. The method according to claim 1, wherein the low-k interlayer dielectric layer is of a silicon based organic-inorganic hybrid material.

5. The method according to claim 4, wherein the silicon based organic-inorganic hybrid material is one of hydrogen silsesquioxane and methyl silsesquioxane.

6. The method according to claim 1, wherein the low-k interlayer dielectric layer is of a polymeric dielectric.

7. The method according to claim 6, wherein the step of treating the top surface of the low-k interlayer dielectric layer includes depositing a thin layer of material containing silicon and nitrogen by vaporization; and curing the deposited silicon and nitrogen containing layer to form the copper diffusion barrier of silicon nitride.

8. The method according to claim 6, wherein the step of treating the exposed surface of the low-k interlayer dielectric layer includes depositing a thin layer of material containing silicon and carbon by vaporization; and curing the deposited silicon and carbon containing layer to form the copper diffusion barrier of silicon carbide.

9. The method according to claim 6, wherein the step of treating the top surface of the low-k interlayer dielectric layer includes applying at least one chemical that contains silicon and carbon; and facilitating silicon and carbon to form a thin layer of silicon carbide on the surface of the low-k interlayer dielectric through chemical reaction.

10. The method according to claim 9, wherein the step of facilitating silicon and carbon to form a thin layer of silicon carbide includes elevating the temperature of the copper damascene structure to about 50 to 100 deg. Celsius.

11. The method according to claim 6, wherein the step of treating the top surface of the low-k interlayer dielectric layer includes applying at least one chemical that contains silicon and nitrogen; and facilitating silicon and nitrogen to form a thin layer of silicon nitride on the surface of the low-k interlayer dielectric through chemical reaction.

12. The method according to claim 11, wherein the step of facilitating silicon and nitrogen to form a thin layer of silicon nitride includes elevating the temperature of the copper damascene structure to about 50 to 100 deg. Celsius.

* * * * *